US006684316B1

United States Patent
Rohrer et al.

(10) Patent No.: US 6,684,316 B1
(45) Date of Patent: Jan. 27, 2004

(54) STORAGE ACCESS UNIT FOR SELECTIVE ACCESS TO A STATIC STORAGE UNIT OR DYNAMIC STORAGE UNIT AND ASSOCIATED ACCESS PROCEDURES

(75) Inventors: Stefan Rohrer, Freiburg (DE); Thomas Himmel, Ettenheim (DE); Manfred Jünke, Gundelfingen (DE)

(73) Assignee: Micronas GmbH (DE)

( * ) Notice: Subject to any disclaimer, the term of this patent is extended or adjusted under 35 U.S.C. 154(b) by 411 days.

(21) Appl. No.: 09/651,516

(22) Filed: Aug. 30, 2000

(30) Foreign Application Priority Data

Aug. 31, 1999 (DE) .......................... 199 41 348

(51) Int. Cl.[7] .............................................. G06F 12/00
(52) U.S. Cl. ........................................ 711/211; 711/104

(58) Field of Search ................................ 711/104, 211, 711/130, 147–148; 710/6; 382/307

(56) References Cited

U.S. PATENT DOCUMENTS

| 4,545,068 A | * | 10/1985 | Tabata et al. ............... 382/307 |
| 4,796,221 A | | 1/1989 | Tokumitsu .................. 711/211 |
| 5,325,513 A | * | 6/1994 | Tanaka et al. ................. 710/6 |
| 5,634,105 A | | 5/1997 | Mizuno ...................... 711/211 |
| 6,141,739 A | * | 10/2000 | Provence et al. ............ 711/211 |

* cited by examiner

Primary Examiner—Nasser Moazzami
(74) Attorney, Agent, or Firm—Harness, Dickey & Pierce, P.L.C.

(57) ABSTRACT

There is here set out a storage access unit, which contains an address register and a data register. A processor has access to these registers independently of any operational mode for access to a static storage unit or a dynamic storage unit.

9 Claims, 4 Drawing Sheets

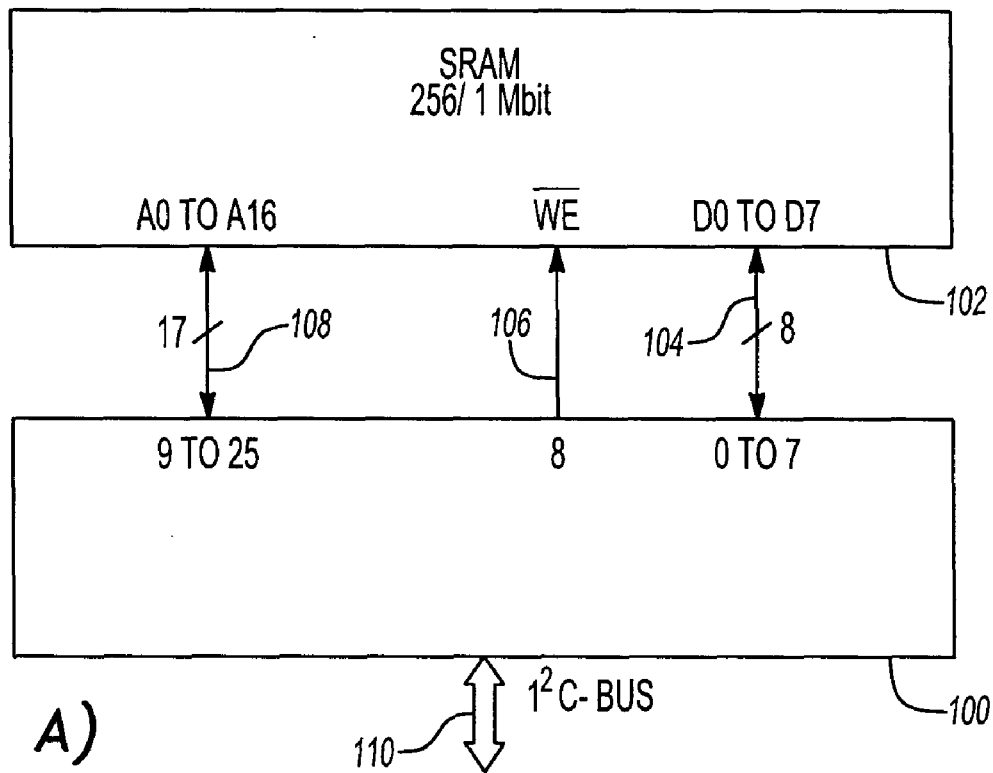
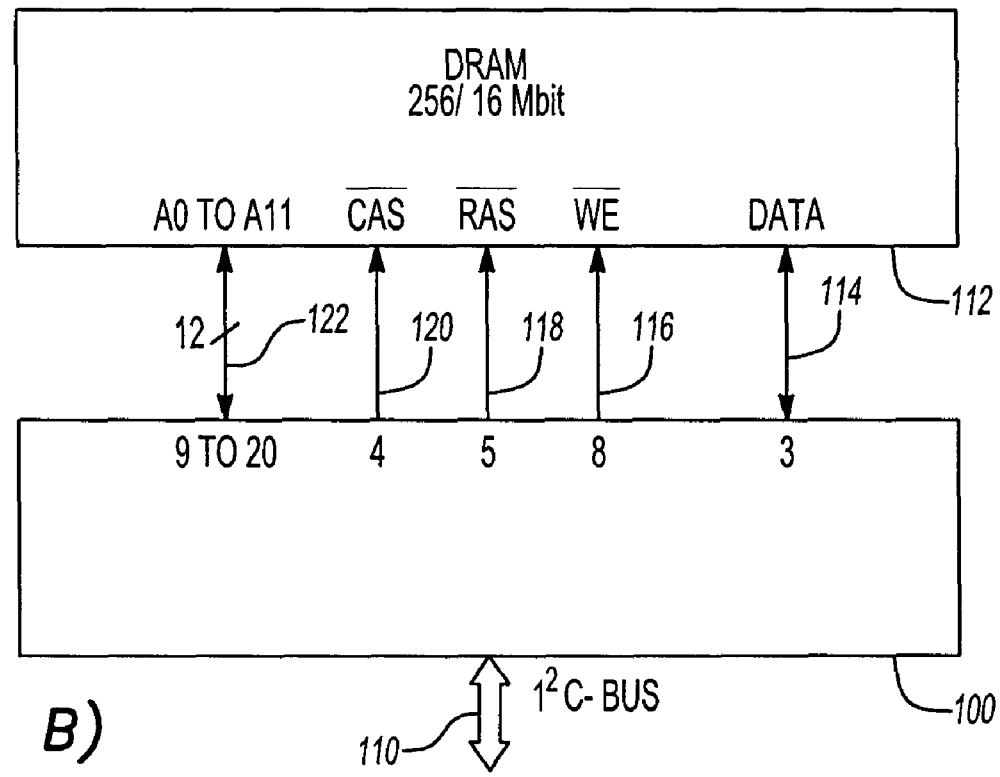
Fig-1

STORAGE ACCESS UNIT FOR SELECTIVE ACCESS TO A STATIC STORAGE UNIT OR DYNAMIC STORAGE UNIT AND ASSOCIATED ACCESS PROCEDURES

BACKGROUND AND SUMMARY OF THE INVENTION

The invention concerns a storage access unit with an internal address bus that contains a pre-set number of internal address lines for transfer of an internal address word. The address word is produced by a processor, for example. The storage access unit contains moreover an internal data bus which contains several internal data lines for the transfer of an internal data word which is written or read by the processor. There is attached to an external address bus of the storage access unit the addressing connections of a static storage unit or the addressing connections of a dynamic storage unit, dependent on the selected mode of operation. The external address bus also contains a pre-set number of external address lines. The data connections of the storage unit are linked to an external data bus of the storage access unit. The external data bus contains a pre-set number of data lines for the transfer of data from or to the storage unit.

A control unit of the storage access unit controls dependent on the chosen mode of operation the passing on of an internal address data word along the external address bus as well as the data transfer between the internal data bus and external data bus.

A RAM (Random Access Memory) is a storage unit with which a person can store data after presentation of an address and read these again under this address, a so-called random access. There is a distinction made between static RAMs (SRAM static random access memory) and dynamic RAMs (DRAM—dynamic random access memory). In the case of static storage units, the storage content remains preserved without extra measures for so long as the operating voltage is applied. In the case of dynamic storage units, the storage content is refreshed by reading accessions which must be carried out at regular intervals so that the storage content is not lost.

It would be possible for the internal address bus to be linked with the external address bus for the operation of a static storage unit. Furthermore, the internal data bus could be linked up with the external data bus. For the operation of a dynamic storage unit there is used a so-called storage controller between an internal address bus and an external address bus, which creates from the internal address word an external line address word for addressing of a line of the storage unit and an external column address word for addressing a column of the storage unit.

As for known circuits with a storage access unit to which selectively a SRAM or DRAM can be connected, their internal design is unfamiliar. There are several possibilities for achieving this function. For every mode of operation it is possible to use its own interface unit, for example.

The invention has the task of offering a simply designed storage access unit for random access to a static storage unit or a dynamic storage unit. Furthermore, procedures are suggested which are carried out in the storage access unit.

This object is solved for a storage access unit by the features indicated in patent claim 1. Further developments are given in the sub-claims.

The invention proceeds from the consideration that it is desirable to give the customer the possibility of using in their appliance a static or dynamic storage unit dependent on market price shortly before the delivery of an appliance. The invention also proceeds from the consideration that it is desirable that a processor using the storage unit should work independently of the operational mode in exactly the same way.

Thus with the storage access unit according to the invention there is used an address register whose address connections are linked with the internal address bus and whose data connections are linked with the internal data bus. The address register serves to store the internal address word to be passed on to the storage unit which is used by the storage unit for access. Moreover, a data register is used with the procedure according to the invention whose address connections are linked with the internal address bus and the data connections to the internal data bus. The data register is used for the intermediate storage of a data word which is already transferred via the external data bus, i.e. read out from the storage unit, or still to be transferred from the external data bus, i.e. to be written into the storage unit. According to the procedure of the invention the processor, independently of the chosen operational mode, always only has access to the address register and data register. The control unit then evaluates the address word stored in the address register dependent on the chosen operational mode and has access to the storage unit. In the case of a write access the data word previously stored in the data register by the processor is given out in the external data bus. In the case of a read access a data word in the storage unit is read from the address given by the address word and written into the data register. From there it is then read out by the processor.

The processor is not in the position when using the storage access unit according to the invention to carry out a storage accession within one processor cycle. A processor cycle is determined by the time that is required for loading the so-called accumulator. In the storage access unit according to the invention the processor must first store an address value in the address register. For this, the address value must be transferred to the internal data bus. Only then can access to the data register ensue. This is however not a disadvantage if the storage access unit is used for an application in which there is sufficient time available for storage access, for example the read-out of a teletext page.

Instruction sequences for the processor can be programmed independently of the storage unit connected later to the storage access unit. This saves expenditure of effort on development. As there is lastly only one instruction sequence for both storage units, storage space for storing the instruction sequence is also spared.

In one development of the storage access unit according to the invention a first data register is used whose address is present on the internal address bus upon writing of an internal data word. The address of a second data register diverges from the address of the first data register. The second data register is addressed on reading an internal data word via the internal address bus. By means of these measures the result is achieved that by addressing the data register it is already determined whether a writing or a reading process is to be carried out, which are dealt with in a different way respectively by the control unit. An assessment of the connection for selecting of a writing or reading operation on the processor may be omitted.

In one embodiment the control unit, when writing a data word into the data register, writes this data word automatically into the storage unit at the address stored in the address register. On reading the second data register the control unit automatically reads a data word from the storage unit which is stored at the address stored in the address register. The data word read out is then stored in the second data register. After access to the data register, access is started automatically to the storage unit, without additional signalling being required.

This leads to shorter access times. If when writing the address register, a data word is read automatically by the control unit from the storage unit, it can thus be achieved that in the case of a subsequent reading access to the data register, the data word stored in the address which is stored in the address register in the storage unit is already stored there. A further reading access to the second data register may be omitted.

The second reading access to the second data register leads to a non-essential extension of the storage access time, if several successive addresses of the storage unit are read. In such a case, the data words are carried over with a delay of one reading cycle of the second data register to the processor.

In order to save connections to the storage access unit, in a further development at least one line of the external address bus or external data bus has the same function independently of the mode of operation. Connections may also be saved if at least one further line of the external address bus or external data bus, dependent on the mode of operation, has various functions. In the last instance, only those functions are involved which are necessary in only one operational mode.

If in one embodiment a data converter is connected between internal and external data bus, so executing a series-parallel or parallel-series conversion, it is possible to use storage units into which the data must be filed serially or from which the data are read out serially.

If there is arranged between the external and internal data bus a decoding unit for recognizing and/or correcting mistakes during transfer of data words, it is possible to avoid malfunctions during data transfer. Should the decoding unit work with serial data, e.g. a hamming decoder, then the data words must be converted with the aid of a parallel-series converter into serial data. A delay in reading the storage unit cannot be avoided by this. In such a case, the client can be given the option, not only of choosing between static storage units and dynamic storage units, but also choosing between storage units that are organized with data words of different word width, i.e. for example between the data word width 1 bit and data word width 8 bits.

The invention concerns moreover procedures for selective access to a static storage unit or a dynamic storage unit with the procedural steps given in patent claim 7 or patent claim 8. These procedures are closely associated technologically with the storage access unit, so that the technical effects indicated above are also valid for the procedures.

BRIEF DESCRIPTION OF THE DRAWINGS

In the following, there are set out embodiments of the invention by means of accompanying drawings which show:

FIG. 1: a storage access unit, to which optionally a static or a dynamic storage unit is connected.

DESCRIPTION OF THE PREFERRED EMBODIMENT

Figure 2:
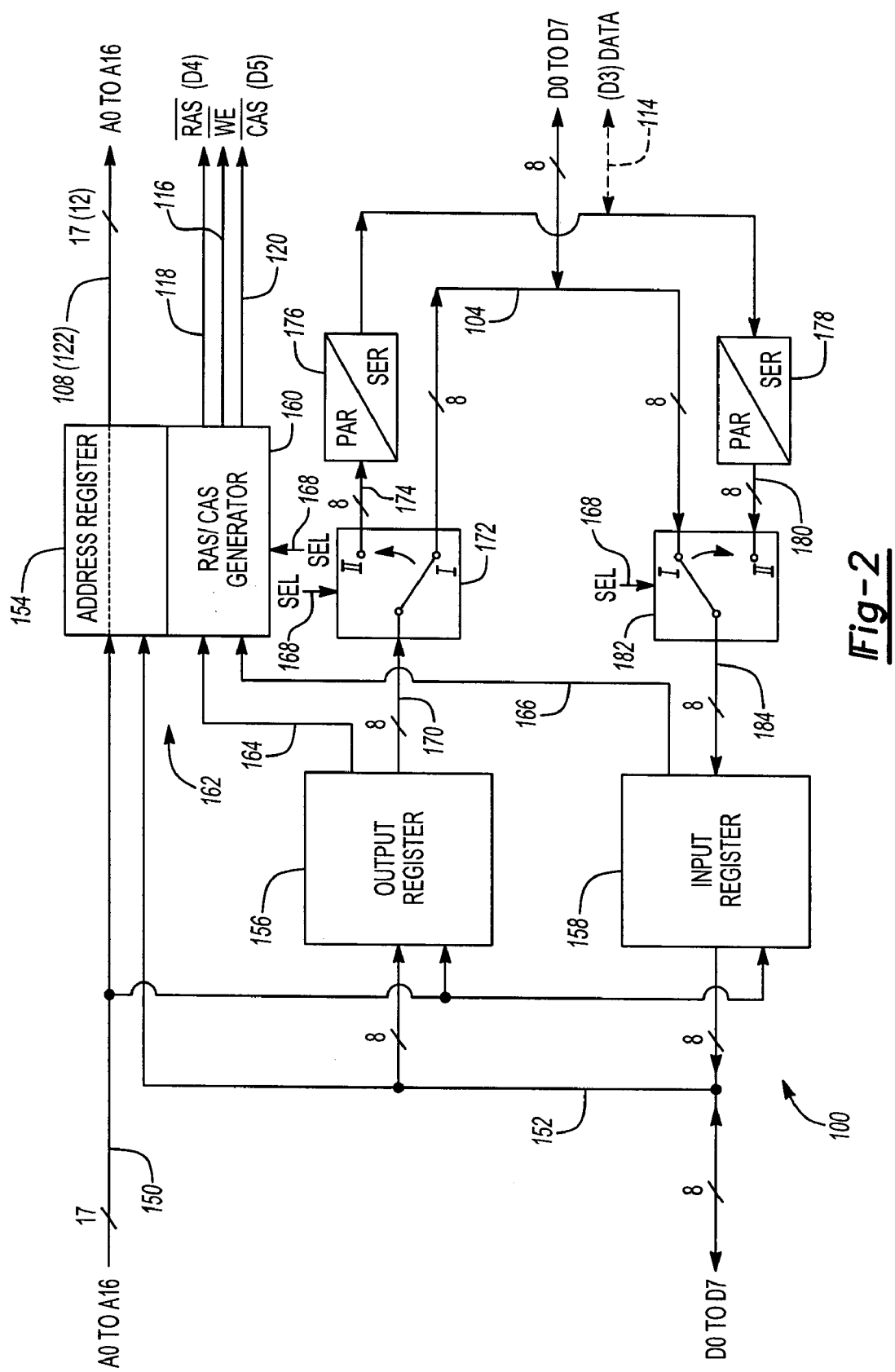
FIG. 2: the design of the storage access unit.

FIG. 1 shows in part a one storage access unit 100, to which a static storage unit 102 (SRAM—Static Random Access Memory) is connected.

The static storage unit 102 can have a storage capacity between 256 KBit and one MBit.

Data connections D0 to D7 of the static storage unit 102 are linked via an external data bus 104 with data connections 0 to 7 of the storage access unit 100. The external data bus 104 contains eight data lines. A write/read selection connector $\overline{WE}$ of the storage unit 102 is linked via a control line 106 with the connection 8 of the storage access unit 100. Should the control line 106 conduct H-potential, then the storage unit 102 is in read mode, i.e. data words can be read out. If L-potential is found on control line 106, the storage unit 102 is in write mode, in which data words are written into the storage unit 102.

Address connections A0 to A16 of storage unit 102 are linked by means of an external address bus 108 with address connections 9 to 25 of the storage access unit 100. The external address bus 108 contains 17 data lines.

From the storage access unit 100 there leads out an industry bus 110 which is internationally standardized and also is designated as $I^2$ C-bus.

Part b of FIG. 1 shows the access unit 100 connected to a dynamic storage unit 112 (DRAM—Dynamic Random Access Memory). The dynamic storage unit 112 has a storage capacity of 256 KBit to 16 MBit. The dynamic storage unit 112, in contrast to the static storage unit 102, is organized not data word fashion but bit fashion. For this reason there is only one data connection DATA with the dynamic storage unit 112 which is linked via a data line 114 with the connection 3 of the storage access unit 100.

The dynamic storage unit 112, too, has a write/read selection connection $\overline{WE}$, which is linked via a control line 116 with the connection 8 of storage access unit 100.

Depending on the potential on control line 116, the dynamic storage unit 112 is working in write or read mode.

A control connection $\overline{RAS}$ (Row Address Strobe) of dynamic storage unit 112 is linked via a control line 118 with the connection 5 of storage access unit 100. A control connection $\overline{CAS}$ of dynamic storage unit 112 is linked via a control line 120 with the connection 4 of storage access unit 100.

Address connections A0 to A11 of dynamic storage unit 112 are linked via an address bus 122 with connections 9 to 20 of storage access unit 100. Firstly, a column address is assigned to the address connections A0 to A11. Subsequently, an L-potential is created at control connection $\overline{RAS}$ by the storage access unit 100. On the basis of this L-potential the address signalled via the external address bus 122 is used as column address for the addressing of the storage unit 122. Then a line address is transferred to the address connections A0 to A11. If the control signal $\overline{CAS}$ is wired by the storage access unit 100 to L-potential, then the address transferred to address connections A0 to A11 is used as line address for the addressing of the storage unit 112.

FIG. 2 shows the design of storage access unit 100, which contains an internal address bus 150 with 17 address lines a0 to a16 and an internal data bus 152 with eight data lines d0 to d7. The internal address bus 150 is linked to the address connections of a processor not shown. The data connections of the processor are linked with the data lines d0 to d7 of data bus 152.

The storage access unit 100 contains an address register 154, an output register 156 and an input register 158, which are linked respectively with the internal address bus 150 and internal data bus 152. It is possible for the respective registers 154, 156 or 158 to be addressed from the processor via the internal address bus 150. The register contents are read out or written with the help of data bus 152 by the processor. Access ensues here to whichever register 152, 154 or 156 whose address is outputted to address bus 150.

The address register 154 together with a signal unit 160 forms an addressing unit 162. The addressing unit 162 is linked on its outlet side with the external address bus 108 or 122. The signal unit 160 is linked on its outlet side with the control lines 116, 118 and 120. From the output register 156 there leads a write line 164 to the addressing unit 162. From the input register 158 there leads a read line 166 to addressing unit 162. An operational mode line 168 also leads to addressing unit 162. An adjustment is made via operational line 168 whether the storage access unit 100 is operated in a SRAM operational mode I for access to the static storage unit 102 or in a DRAM operational mode II for access to dynamic storage unit 112.

The output register 156 is linked on its outlet side with eight data lines of a data bus 170, which leads to a switching unit 172. The data lines of the data bus 170 can optionally be linked with the eight data lines of a data bus 174 or with the eight data lines of the data bus 104. The switching unit 172 is wired dependent on the potential on operational mode line 168. Data bus 174 leads to a parallel-series converter 176, whose outlet is linked with the data line 114.

The data line 114 leads moreover to the inlet of a series-parallel converter 178, whose outlet is linked with a data bus 180. The data bus 180 contains eight data lines and leads to the one inlet of a switching unit 182. The other inlet of switching unit 182 is linked to external data bus 104. The switching unit 182 links up, dependent on the operational mode set via the operational mode line 168 either data bus 180 or data bus 104 with a data bus 184 at the outlet of switching unit 182. The data bus 184 leads to the inlets of the input register 158.

Firstly, the function of storage access unit 100 in its SRAM operational mode I needs to be enlarged upon. In this operational mode the switching unit 172 links up data bus 170 with the external data bus 104. The switching unit 182 links up the external data bus 104 with data bus 184. The signaling unit 160 creates only control signals on control line 116 for the write/read selection connection $\overline{WE}$.

When writing a data word into the static storage unit 102 the processor firstly creates an address word on the internal address bus 150, which addresses the address register 154. At the same time a data word is written on the inner data bus D0 to D7 by the processor into the upper bit positions of address register 154. Then with the very same address word there are written by the processor on the internal address bus a0 to a16 the lower bits of the address register. In this way a data word is transferred to the internal data bus 152. In address register 154 there is now located an address word whose value indicates the storage cell of the static storage unit 102 in which a data word is to be written.

The processor then addresses via the internal address bus 150 the output register 156 and writes at the same time into the output register 156 via the internal data bus 152 the data word later to be transferred to storage unit 102. In output register 156 there is created a signal because of the addressing of this output register 156 on write line 164, which signals to the address unit 162, that access to storage unit 102 may begin. The data word stored in output register 156 arrives via data bus 170, the switching unit 172 at external data bus 104. The addressing unit 162 controls the writing of the data word into storage unit 102. In this way an address word is transferred on to external address bus 108, which corresponds to the address value stored in address register 154.

In order to read the storage unit 102 the processor must firstly address via internal address bus 150 the address register 154 and input an address word into the address register 154 via the internal data bus 152, whose value determines the storage cell to be read of the storage unit 102. Subsequently, the input register 158 is addressed via the internal address bus 150 by the processor. At the same time a data word is read from the input register 158 via the internal data bus 152. This data word is not processed further by the processor. By a reading of the input register 158 a signal is created on read line 166, which signals to the addressing unit 162 that reading of storage unit 102 can begin. The addressing unit 154 sends the address word stored in address register 154 via the external address bus 108 to storage unit 102. Whereupon data about the data word to be read are given out at the external data bus 104. These data arrive via the switching unit 182 and data bus 184 at input register 158. The processor reads this data word from the input register 158 in a subsequent step, this input register 158 being addressed via the internal address bus 150.

Should the stored value in address register 154 be automatically raised after each read access, then the data words from stored addresses with consecutive address values can be read out from the input register 158 with a delay of one read access, without there being more steps to be carried out by the processor than with a direct access to storage unit 102.

In DRAM operational mode II the switching unit 172 links up data bus 170 with data bus 174. The switching unit 182 links up data bus 180 with data bus 184. The signal unit 160 creates the signals required for access to dynamic storage unit 112 on control lines 116, 118 and 120.

In order to write a data word into the storage unit 112, the processor firstly loads the address value of the storage cell to be written into the address register 154, as enlarged upon above. Subsequently, the processor addresses the output register 156 via the internal address bus 150. At the same time the data word to be written is written into the output register 156 via the internal data bus 152. This causes a start signal on write line 164. As a result of the start signal the addressing unit 162 executes a read access to the storage unit 112. In this way, firstly the lower bits of the address data word in address register 154 are given out at external address bus 122. At the same time the control signal $\overline{RAS}$ is switched on to L-level. Then the higher bits of the address word stored in the address register are given out via the external data bus 122 and the control signal $\overline{CAS}$ set at L-level. The datum in the lowest bit of the data word stored in output register 156 is given out at the outlet of the parallel-series converter 176 and written into the storage cell of storage unit 112 indicated in address register 154. Thereafter seven further storage cells with the subsequent seven address values are automatically written with data which are given out consecutively at the outlet of the parallel-series converter 176.

On reading storage unit 112 the processor firstly transfers again into address register 154 an address word whose value indicates the storage cell of storage unit 112 to be read. Thereafter a read access is executed by the processor on input register 158. This read access has as a result that a read access on storage unit 112 is started automatically by addressing unit 162 via read line 166. Firstly, a datum is read out of a storage cell whose address value is stored in address register 154. This datum arrives via data line 114 at the inlet of the series parallel converter 178. Then the data are read out automatically from seven storage cells whose address values follow the value of the address word stored in address register 154. These data too arrive at series-parallel converter 178. At the outlet of converter 178, after the eighth read access, a data word is given out and written into the input register 158.

The processor in a second read access now reads from input register 158 the data word stored there, which is used for further processing. The read accessions of the processor on the input register 158 ensue in both operational modes with similar time intervals. The time interval is determined by the duration of the storage access in the slower operational mode.

Figure 3:
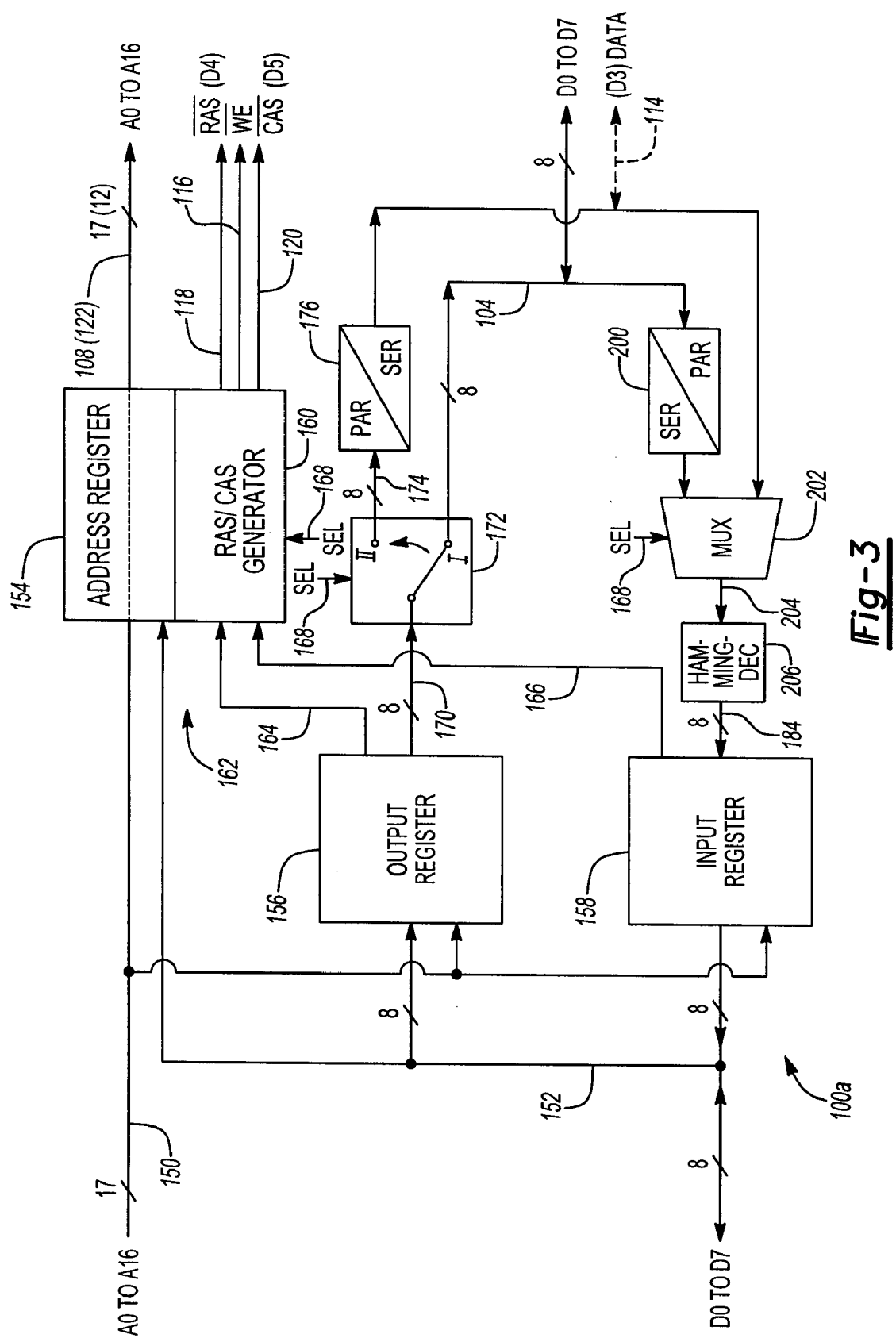
FIG. 3: the design of a second embodiment of the storage access unit.

FIG. 3 shows the design of a storage access unit 100a according to a second embodiment. Similar component parts of the storage access unit 100 and 100a are distinguished by similar reference numbers. The storage access unit 100a contains no switching unit 182 and no series-parallel converter 178. The external data bus 104 leads to the inlets of a parallel-series converter 200. The outlet of converter 200 is linked up to the input of a multiplexer 202. The other inlet of multiplexer 202 is linked up with data line 114. The operational mode line 168 is connected to the control inlet of multiplexer 202. In the SRAM operational mode I, the inlet of multiplexer 202 linked up with converter 200 is linked up with its outlet. In the DRAM operational mode II, the inlet of multiplexer 202 linked up with data line 114 is linked up with the outlet of multiplexer 202. At the outlet of multiplexer 202 there is connected a link line 204, which leads to the inlet of a hamming decoder 206. Eight outlets of the hamming decoder 206 are linked up with the data lines of data bus 184. Otherwise the design of the storage access unit 100a tallies with the design of access unit 100.

In what follows, only the differences in the method of functioning of the storage access units 100 and 100a will be enlarged upon. Data words which are to be written into storage unit 102 or storage unit 112 are firstly coded according to the so-called hamming code. Access to the storage unit 102 or 112 occurs then as set out for the storage access unit 100.

During reading of storage unit 102 in the SRAM operational mode I a data word transferred on the external data bus 104 is separated into several data by the parallel-series converter 200 which data arrive consecutively via the multiplexer 202 at the hamming decoder 206. The hamming decoder 206 decodes the data according to hamming code and thus corrects errors. A decoded data word is written then into input register 158 at the outlet of hamming decoder 206. The other processes during reading of storage unit 102 in operational mode I tally with the processes set out above for the storage access unit 100.

During reading of storage unit 112 in the DRAM operational mode II eight data arrive successively via the data line 114 at the multiplexer 202 and then at hamming decoder 206. In hamming decoder 206, these data are decoded and a data word is created at the outlet of the hamming decoder 206, which is stored in input register 158. Otherwise the processes during reading of storage unit 112 tally with the processes set out above.

Figure 4:
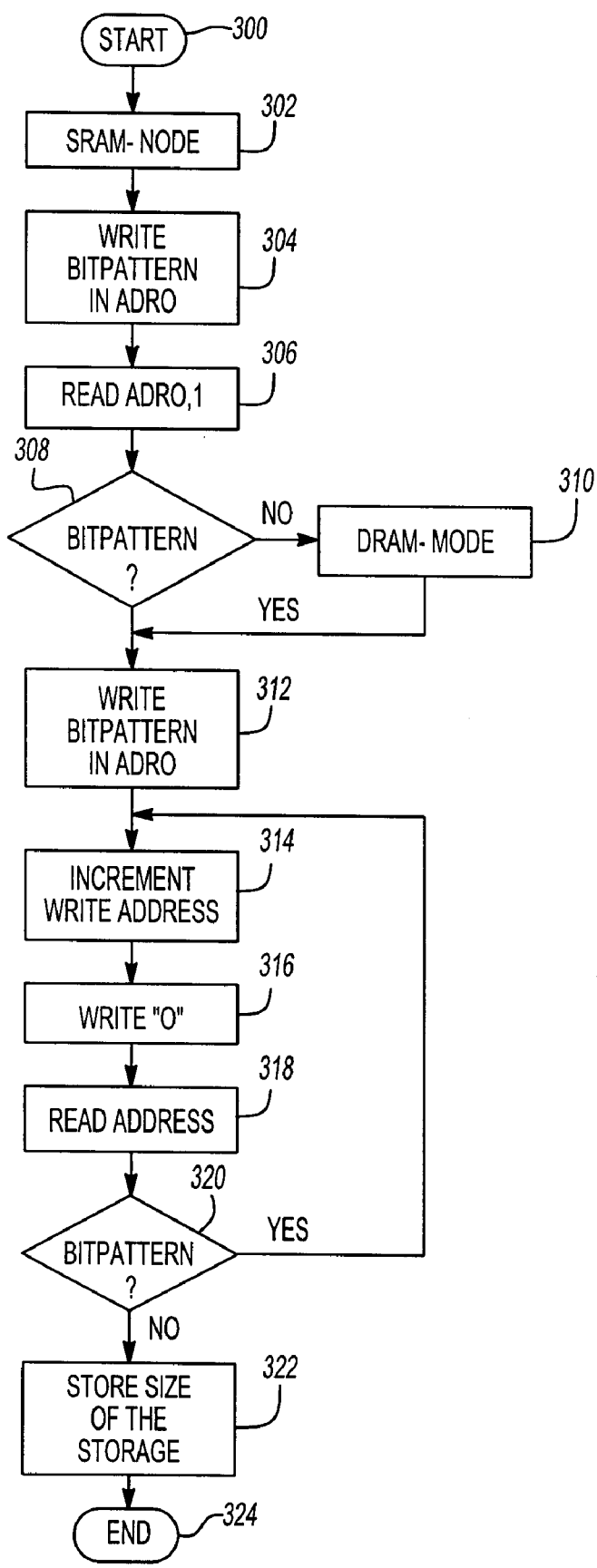
FIGS. 4A and 4B: procedural steps for automatically ascertaining the operational mode and the storage capacity of a storage unit.

The FIGS. 4A and 4B show a flow diagram with procedural steps for the automatic locating of operational mode I or II as well as locating the storage capacity of storage unit 102 or 112. The procedure begins with a step 300. In a step 302 the operational mode I is pre-set. In a subsequent step 304 two different bit maps are written to the address ADR0 and ADR1. The writing of different bit maps ensures that recognition can be carried out securely, even if by chance bit maps are stored in the storage unit which tally with the first or second bit map.

In one procedural step 306 the addresses ADR0 and ADR1 are read. In a procedural step 308 a check is made whether the data words read tally with the bit maps used with procedural step 304. Should this not be the case, operational mode II is pre-set in a procedural step 310, i.e. the DRAM operational mode. Subsequently, the procedure is continued in a procedural step 312.

After procedural step 308 there follows immediately procedural step 312, if it has been established in procedural step 308 that the data words read in procedural step 306 tally with the bit maps used in procedural step 304. In such a case the operational mode is not changed.

In procedural step 312 there is written to address ADR0 a further bit map, e.g. the sedezimal value 13. In a procedural step 314 the write address is raised by a pre-set value. The incrementation of the write address in procedural step 314 can be executed in greater steps, e.g. in 16 KB steps.

In a procedural step 316, the value 0 is written to the current write address. In a following procedural step 318 the address ADR0 is read. In a procedural step 320 the value read in procedural step 318 is compared with the bit map used in procedural step 312. If it is established that these tally, the procedure is continued in step 314. Here it happens that the procedure gets into a procedural loop from the procedural steps 314 to 320 which is run through until it is established in procedural step 320 that the bit map stored in procedural step 312 is no longer stored in address ADR0. This is to be referred back to the fact that the write address 314 has been raised until such time as the address value ADR0 has been reached again.

In the event of the bit map stored in the address ADR0 being overwritten, there immediately follows procedural step 322 after procedural step 320. In procedural step 322 the size of the storage is stored in a register for later processing. Finally, the procedure concludes with a procedural step 324.

What is claimed is:

1. A storage access unit for selective access to a static storage unit or a dynamic storage unit, with
  an internal address bus, which contains a predetermined number of internal address lines for transferring an internal address word,
  an internal data bus, which contains several internal data lines for transferring an internal data word,
  an external address bus which contains a predetermined number of external address lines for addressing a static storage unit in a first operational mode and for addressing a dynamic storage unit in a second operational mode dependent on an internal address word,
  an external data bus which contains a predetermined number of data lines for transferring data from or to the storage unit,
  and with
    a control unit which controls the passing on of an internal address word to the external address bus as well as the data transfer between the internal data bus and external data bus, dependent on the chosen operational mode, wherein an address register serving to store the internal address word for passing on, whose address connections are linked up to the internal address bus and whose data connections are linked up to the internal data bus, at least one data register for intermediate storage of a data word already transferred via the external data bus or yet to be transferred by the external data bus, such a register having address connections linked up with the internal address bus and whose data connections are linked up to the internal data bus.

2. The storage access unit according to claim 1, further comprising a first data register whose address is present on the internal address bus during writing an internal data word, and a second data register, whose address diverges from the address of the first data register and which is addressed during reading of an internal data word via the internal address bus.

3. The storage unit according to claim 2, wherein in that during writing a data word into the first data register the control unit automatically writes the data word into the storage unit at the address stored in the address register, or during reading of the second data register or during writing of the address register the control unit automatically reads from the storage unit a data word which is stored at the address stored in the address register.

4. The storage unit according to claim 1, wherein at least one line of the external address bus or of the external data bus, independently of the operational mode has the same function, or at least one further line of the external address bus or of the external data bus dependent on the operation mode has various functions.

5. The storage unit according to claim 1, wherein between the external data bus and the internal data bus at least one data converter is connected, which outputs data transferred serially at the same time as one data word or which outputs serially at the same time input data of one data word.

6. The storage unit according to claim 1, wherein there is a decoding unit arranged between the external data bus and the internal data bus for the recognition or correction of errors during transfer of data words.

7. A method for the selective access to a static storage unit or a dynamic storage unit, storing an address word in an address register having address connections linked to an internal address bus including a predetermined number of internal address lines for transferring the address word, storing a data word in a data register having address connections linked to the internal address bus and data connections linked to an internal data bus including a plurality of internal data lines for transferring the data word, wherein the data word has been transferred to the data register over an external data bus containing a predetermined number of data lines for transferring the data word from the static storage unit in a first operational mode and from the dynamic storage unit in a second operational mode, the data word being transferred from a storage cell of the storage unit indicated by the address word transferred to an external address bus containing a predetermined number of external address lines for addressing the storage unit, or the data word is to be transferred over the external data bus to the static storage unit in the first operational mode and to the dynamic storage unit in the second operational mode, the data word being transferred to a storage cell of the storage unit indicated by the address word to be transferred to the external address bus; and controlling the transferring of the address word to the external address bus, as well as the transferring of the data word between the internal data bus and the external data bus using a control unit.

8. The method according to claim 7, wherein storing the address word in the address register and storing the data word in the data register ensue by way of the processor independently of the chosen operational mode.

9. The method according to claim 7, wherein the operational mode is ascertained automatically through the processor.

* * * * *